United States Patent
Joos et al.

(10) Patent No.: US 10,770,564 B2
(45) Date of Patent: Sep. 8, 2020

(54) MOS COMPONENT, ELECTRIC CIRCUIT, AND BATTERY UNIT FOR A MOTOR VEHICLE

(71) Applicant: Robert Bosch GmbH, Stuttgart (DE)

(72) Inventors: Joachim Joos, Gerlingen (DE); Walter von Emden, Enigen Unter Achalm (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/349,154

(22) PCT Filed: Sep. 13, 2017

(86) PCT No.: PCT/EP2017/073023
§ 371 (c)(1),
(2) Date: May 10, 2019

(87) PCT Pub. No.: WO2018/086787
PCT Pub. Date: May 17, 2018

(65) Prior Publication Data
US 2019/0273146 A1    Sep. 5, 2019

(30) Foreign Application Priority Data
Nov. 11, 2016  (DE) .................. 10 2016 222 213

(51) Int. Cl.
*G11C 16/10*    (2006.01)
*H01L 29/51*    (2006.01)
(Continued)

(52) U.S. Cl.
CPC ............ *H01L 29/512* (2013.01); *B60L 50/64* (2019.02); *G11C 16/0466* (2013.01);
(Continued)

(58) Field of Classification Search
CPC ................. G11C 16/10; G11C 16/26
(Continued)

(56) References Cited

U.S. PATENT DOCUMENTS

| 6,159,829 A | 12/2000 | Warren et al. | |
| 2002/0028541 A1* | 3/2002 | Lee ..................... | H01L 29/7881 438/149 |

(Continued)

FOREIGN PATENT DOCUMENTS

DE    10158019 A1    6/2003

OTHER PUBLICATIONS

International Search Report for PCT/EP2017/073023, dated Dec. 7, 2017.

*Primary Examiner* — Michael T Tran
(74) *Attorney, Agent, or Firm* — Norton Rose Fulbright US LLP; Gerard Messina

(57) ABSTRACT

A MOS component includes a source area, a drain area, a body area, a channel area, and a gate element, the channel area and the gate element being electrically insulated with respect to one another by a total of at least three individual layers in the form of a first individual layer, a second individual layer, and a third individual layer. The second individual layer is designed in such a way that it may permanently store electric charges. The third individual layer, which is situated between the channel area and the second individual layer, has a greater equivalent oxide thickness than the first individual layer situated between the second individual layer and the gate element.

17 Claims, 7 Drawing Sheets

(51) Int. Cl.
  *B60L 50/64*    (2019.01)
  *G11C 16/04*    (2006.01)
  *H01L 23/525*   (2006.01)
  *H01L 29/423*   (2006.01)
  *H01L 29/792*   (2006.01)
  *H01L 21/28*    (2006.01)
  *H01L 29/788*   (2006.01)
  *H01M 2/34*     (2006.01)
  *H01M 10/42*    (2006.01)

(52) U.S. Cl.
  CPC .......... *G11C 16/10* (2013.01); *H01L 23/5252* (2013.01); *H01L 29/40114* (2019.08); *H01L 29/40117* (2019.08); *H01L 29/4234* (2013.01); *H01L 29/7883* (2013.01); *H01L 29/792* (2013.01); *H01M 2/34* (2013.01); *H01M 10/4257* (2013.01); *H01M 2220/20* (2013.01)

(58) Field of Classification Search
  USPC ........................................ 365/185.18, 185.24
  See application file for complete search history.

(56) References Cited

U.S. PATENT DOCUMENTS

| | | | |
|---|---|---|---|
| 2003/0045082 A1 | 3/2003 | Eldridge et al. | |
| 2003/0198086 A1* | 10/2003 | Shukuri | B82Y 10/00 365/185.18 |
| 2005/0157549 A1 | 7/2005 | Mokhlesi et al. | |
| 2009/0050953 A1 | 2/2009 | Wang et al. | |
| 2009/0103370 A1 | 4/2009 | Lue | |
| 2009/0294861 A1* | 12/2009 | Thomas | H01L 27/11 257/368 |
| 2012/0080739 A1* | 4/2012 | Hagishima | G11C 16/0408 257/324 |
| 2014/0361354 A1* | 12/2014 | Ting | H01L 21/31051 257/288 |
| 2015/0102411 A1* | 4/2015 | Ching | H01L 29/1054 257/347 |
| 2015/0157549 A1 | 6/2015 | Murakami et al. | |
| 2016/0056301 A1* | 2/2016 | Lee | H01L 29/792 365/185.29 |
| 2016/0099684 A1* | 4/2016 | Qiu | H01L 27/0688 330/307 |
| 2016/0114692 A1 | 4/2016 | Tripathi et al. | |
| 2016/0126248 A1* | 5/2016 | Rabkin | H01L 27/1157 257/321 |
| 2016/0133650 A1* | 5/2016 | Sugawara | H01L 29/42384 257/40 |
| 2016/0133727 A1* | 5/2016 | Hashemi | H01L 29/6653 257/288 |
| 2016/0153882 A1* | 6/2016 | White | G01N 27/4141 73/29.03 |
| 2016/0181431 A1* | 6/2016 | Yamazaki | H01L 27/1443 257/43 |
| 2016/0197099 A1* | 7/2016 | Sasaki | H01L 29/66969 257/43 |
| 2016/0211259 A1* | 7/2016 | Guo | H01L 21/823885 |
| 2016/0233231 A1* | 8/2016 | Lee | H01L 27/1157 |
| 2017/0053915 A1* | 2/2017 | Ando | H01L 21/8258 |
| 2017/0077286 A1* | 3/2017 | Lo | H01L 21/823807 |
| 2017/0077314 A1* | 3/2017 | Smith | H01L 21/76264 |
| 2017/0110464 A1* | 4/2017 | Rabkin | H01L 29/1033 |
| 2017/0125082 A1* | 5/2017 | Yoon | G11C 11/4076 |
| 2017/0125436 A1* | 5/2017 | Sharangpani | H01L 27/11582 |
| 2017/0133406 A1* | 5/2017 | Akarvardar | H01L 27/0886 |
| 2017/0250193 A1* | 8/2017 | Huo | H01L 27/11582 |
| 2017/0309649 A1* | 10/2017 | Hayashi | H01L 27/1251 |
| 2019/0334010 A1* | 10/2019 | Avci | H01L 29/78391 |
| 2020/0035304 A1* | 1/2020 | Tailliet | H01L 29/42328 |
| 2020/0035683 A1* | 1/2020 | Sharma | H01L 24/17 |
| 2020/0044087 A1* | 2/2020 | Guha | H01L 29/0673 |
| 2020/0052087 A1* | 2/2020 | Lee | H01L 29/16 |
| 2020/0058798 A1* | 2/2020 | Pillarisetty | H01L 29/66969 |

* cited by examiner

MOS COMPONENT, ELECTRIC CIRCUIT, AND BATTERY UNIT FOR A MOTOR VEHICLE

FIELD OF THE INVENTION

The present invention relates to a MOS component, an electrical circuit, and a battery unit for a motor vehicle including such a MOS component.

BACKGROUND INFORMATION

The availability of reliable and heavy-duty accumulator technology is of great significance for future electromobility concepts. While electric motors and other aspects of automotive engineering are already highly advanced in terms of their development and are available in satisfactory levels of quality, accumulator technology is one of the key elements for electromobility. The critical aspects here are, mainly, the storage density, which is directly reflected in the range of the vehicles, and the handling of the energy stores. Given a reasonable overall weight, electrically driven vehicles achieve considerably shorter ranges, due to the limited capacity of the accumulators, than vehicles including an internal combustion engine. In addition, the production costs for electrically driven vehicles are presently still considerably higher than for conventional motor vehicles including an internal combustion engine.

In addition to the increase in the storage density and the simultaneous reduction of the costs, the functional reliability of the batteries is of decisive significance for the comprehensive utilization in the automobile. If there is an internal short circuit of the battery, whether due to mechanical damage or dendrite growth, a controlled discharge of the battery is desirable, so that an uncontrolled energy release may not result in explosions or the development of smoke or flames.

Therefore, it is desirable to create a possibility for carrying out a controlled discharge of the affected accumulator cell in the event of a fault. Previously, thermal/mechanical antifuse approaches, in which long-term stable short circuits are generated, for example, with the aid of pyrotechnics or melting through, were available for this purpose. Electronic options having the required non-volatility are not available so far, however.

SUMMARY

According to the present invention, a MOS component including a gate element and a channel area is made available, an electrically insulating layer made up of at least three individual layers being situated between the gate element and the channel area, a first individual layer adjacent to the gate element being made of an electrically insulating material, a second individual layer which abuts neither the gate element nor the channel area is a storage layer which is provided for permanently storing charges, and a third individual layer adjacent to the channel area is made of an electrically insulating material. The MOS component is distinguished by the fact that the totality of the individual layers situated between the channel area and the second individual layer has a greater effective oxide thickness than the totality of the individual layers situated between the second individual layer and the gate area.

A MOS component is understood to be a metal-oxide-semiconductor component, for example, a MOSFET, i.e., a "metal oxide semiconductor field effect transistor", or a MOS diode. Further, possibly multifunctional components are also conceivable, which, however, include at least one section according to the present invention having the disclosed function.

A gate element is understood to be, in particular, a component or a section of the part or of a component, which, upon application of a voltage to the gate element or in the event of a change of a voltage applied to the gate element, effectuates a change of the conductivity from source to drain of the MOS component.

A channel area is understood to be, in particular, a section of a doped semiconductor material, whose conductivity may be changed by applying a voltage to the gate element. In this case, a space charge zone having strong inversion is created, an n-type area becomes p-type as a result, and vice versa.

An equivalent oxide thickness EOT is understood to be a variable which indicates the insulating effect of a dielectric in the unit of a layer thickness of silicon oxide. Specifically, in this case, the actual layer thickness $d_{mat}$ is modified via the ratio of the electric field constant $\varepsilon_{r,mat}$ of the affected material with respect to the electric field constant $\varepsilon_{r,\,SiO2}$ of the silicon oxide as factor:

$$EOT = d_{mat} \cdot \frac{\varepsilon_{r,mat}}{\varepsilon_{r,SiO_2}}$$

The MOS component according to the present invention, for example, a MOSFET or a power MOSFET, having a low channel resistance and a cutoff voltage, which is low, if necessary, and has been adapted to the battery cell to be protected, may be utilized as the protective or short-circuit element for the battery cell. The component includes a charge storage layer which may trap, i.e., capture and store, charges and, therefore, change the cutoff voltage of the transistor, i.e., the voltage at which the MOSFET switches.

The cutoff voltage of the MOSFET may be changed by introducing or withdrawing electric charge into or from the storage layer. If the introduced charge is sufficiently high, the sign of the cutoff voltage, and therefore, the characteristic of the component, may change in the state without voltage applied to the gate. The formula applies:

$$\Delta V_{th,Nnit} = -\frac{qN_{nit}}{\varepsilon_0} \cdot \left( \frac{d_{topox}}{\varepsilon_{r,SiO_2}} + \frac{d_{nit}}{2 \cdot \varepsilon_{r,nit}} \right)$$

$\Delta V_{th,Nnit}$ being the difference of the cutoff voltage with respect to the cutoff voltage in the neutral state depending on the charge $N_{nit}$ introduced into the storage layer, usually, therefore, the nitride layer, $d_{topox}$ being the thickness of the top oxide, i.e., of the third individual layer, $d_{nit}$ being the thickness of the nitride layer or storage layer, i.e., the second individual layer, and $\varepsilon_0$, $\varepsilon_{r,SiO2}$ and $\varepsilon_{r,nit}$ being the known electric field constants for the vacuum, silicon oxide, and silicon nitride. If the storage layer is not made of silicon nitride, the material constants of the corresponding material must be utilized for the calculation, of course.

The MOS component according to the present invention has the advantage that a long-term stable short-circuit switch, which may also be referred to as an antifuse, is available for the first time. It may be utilized, for example, as battery protection. The MOS component, in particular, a MOSFET, may be transferred from a "normally off" state, i.e., a self-blocking state, in which the component is in the so-called enhancement mode, into a "normally on" state, i.e., a self-conducting state, in which the component is in the so-called depletion mode, and vice versa, via manipulation of the storage layer. Both states have long-term stability for many years and are not reliant on a permanent power supply. A component blocking in the normal state may therefore become a permanently conductive component, for example, a so-called self-retaining MOSFET.

If a malfunction at a battery cell is established, the storage layer may be manipulated, with the aid of a programming voltage applied to the gate element, for example, in the form of a programming pulse, in such a way by introducing or withdrawing charge that the MOS component switches from the blocking state into the conductive state and, therefore, allows for a controlled discharge of the battery cell. If the charge of the storage layer has already been changed one time, the system is no longer dependent on an external voltage source, which is essential in the case of a protection system for defective battery cells, since the fault source could also influence the corresponding external voltage source.

A short circuit MOSFET according to the present invention in the mentioned battery application must be reliably low-resistance throughout the entire service life without an external power supply being available, since the battery, as a power source, may either be destroyed or may have a very low voltage drop due to the short circuit at the external MOSFET, on the basis of which a switch signal may no longer be generated with the aid of charge pumps. In the case as well of a complete discharge of the battery some time after the fault event, the SR (self-retaining) MOSFET according to the present invention remains on and may ensure a reliable bridging of the cell, for example, in the case of a series connection of individual battery cells.

Possible areas of application of the present invention are lithium ion batteries, for example, for electric automobiles, hybrid automobiles, but also for tools or consumer electronics, for lead-acid batteries, lithium-polymer batteries, lithium-iron-phosphate batteries, or lithium-titanate batteries, and generally for energy stores, in particular, in the field of electromobility and power electronics. The functional reliability of the battery technology in the mentioned areas of application may be enhanced in this way.

In one advantageous embodiment, it is provided that an entire equivalent oxide thickness of all individual layers situated between the gate element and the channel area is between 15 nm and 25 nm, preferably between 18 nm and 22 nm, particularly preferably between 19 nm and 21 nm. Such an embodiment is advantageous for the efficiency of the component. The equivalent oxide thickness of the entire insulating layer is directly correlated to the required gate voltages and to the withstand voltage of the entire component.

The first individual layer and the third individual layer may each be made of silicon oxide ($SiO_2$), and the second individual layer may be made of silicon nitride ($Si_3N_4$). Both substances have been sufficiently known from the related art, so this will not be dealt with in greater detail at this point. Other materials for the insulating individual layers, such as aluminum oxide ($Al_2O_3$) or another oxide having a high k value, as well as alternative materials, are likewise possible for the storage layer, of course.

Alternatively, it is possible that the second individual layer is designed as a floating gate. It may then be made of polysilicon. Whether a design of the second individual layer, i.e., the storage layer, as a floating gate made of polysilicon or, as described above, of silicon nitride, is to be preferred depends on the specific application. Both variants involve different required layer thicknesses and doping, which may result in different channel resistances. A low channel resistance is usually to be preferred in this case.

Advantageously, the second individual layer has a thickness between 8 nm and 12 nm, preferably between 9 nm and 11 nm, particularly preferably between 9.5 nm and 10.5 nm. Such a configuration yields a versatile component. Other layer thicknesses may also be advantageous for special applications.

For the utilization within the scope of the energy supply for a motor vehicle, it is advantageous when, upon application of a programming voltage to the gate element having an absolute value of 15 V to 25 V, preferably of 18 V to 22 V, particularly preferably of 19 V to 21 V, charges tunnel from the gate element into the second individual layer or from the second individual layer into the gate element, while, simultaneously, no charges tunnel from the second individual layer into the channel area or from the channel area into the second layer. Voltages in the mentioned area are easily available, but are simultaneously high enough to reliably rule out an inadvertent switching of the component from the one state into the other state.

The tunnel process may advantageously be a Fowler-Nordheim tunneling. It is then not necessary that charges, i.e., electrons or holes, tunnel through the entire energy barrier of the particular insulating layer, but rather the band diagram is already slightly bent due to the application of a voltage to the gate, so that the effective barrier for the charges is reduced. Fowler-Nordheim tunneling generally sets in at a voltage of approximately 10 MV/cm and higher.

In one advantageous embodiment of the present invention, the programming voltage is configured in the form of a voltage pulse. A permanent voltage source is not necessary therefor. Instead, the voltage pulse may be held in readiness, for example, in the form of a charged capacitor. The voltage pulse may have, for example, a length between 100 µs and 1 ms and a voltage of between 5 V and 20 V. A programming voltage in the form of a voltage pulse having a length between 100 µs and 1 ms may suffice for changing the charge in the second individual layer with the aid of a tunnel current in such a way that the MOS component permanently transitions from a blocking state into a conductive state, or vice versa. The switching process, which is essential to the present invention, may therefore be easily triggered.

In order to allow for a controlled discharge of a battery cell, it is advantageous when the MOS component transitions from a normally off state into a normally on state due to the tunneling. The component may thus effectuate a controlled short circuit, for example, of a defective battery cell, which then results in a slow discharge of the battery cell.

One alternative embodiment advantageously provides that the second individual layer is electrically precharged in a delivery state of the MOS component. It is then advantageously possible that charges stored in the second individual layer may be released by applying a voltage to the gate element. This process is referred to as "detrapping". In this case, the storage layer is not charged, but rather discharged, in order to switch or reprogram the component. This may be advantageous when it is desired that specifically electrons or holes tunnel, which may result in considerable changes of the required programming voltage and other parameters due to the different effective masses.

The precharging of the floating gate with electrons may be achieved with the aid of negative voltage at the gate during the final measuring, i.e., in a test step during production. As a result, the native threshold voltage, which is less than 0 V, is increased, for example, to 3 V to 5 V via injection. In the operating condition or in the "on" condition of the component, a reverse tunneling of the electrons to the gate is achieved with the aid of a slight positive preload of the gate, so that the component is reprogrammed to lower cutoff voltages which, again, are less than 0 V, and subsequently remains open even without a gate voltage.

One refinement of the present invention provides that the first intermediate layer is thinned out in at least one area, so that charges may be injected into the second individual layer through the thinned-out area. In this way, an anisotropy of the tunnel barrier may be achieved. It is then easier for the charges to tunnel into the storage layer than to tunnel out of the storage layer. The temporal stability of the "self-retaining" state, i.e., the conductive state, is enhanced in this way.

According to the present invention, moreover, an electrical circuit is provided, which includes an ASIC, i.e., an application-specific integrated circuit, which is also referred to as a "custom chip", and a MOS component according to the present invention. The ASIC may be utilized for monitoring the state of the battery cell to be secured.

When the ASIC detects a fault condition, the ASIC may initiate the triggering of the antifuse, so that the battery cell is discharged in a controlled manner. In particular, the ASIC may trigger or provide the voltage pulse functioning as the programming pulse, in order to reprogram the MOS component and, in this way, establish the desired short circuit.

In one advantageous refinement, the ASIC may include a charge store for this purpose. In the charge store, an amount of charge may be stored, which is great enough to place a sufficient amount of charge in the storage layer of the MOS component, in order to achieve a switching of the MOS component into the conductive state. The charge store may be, for example, a capacitor or a small battery.

One advantageous embodiment of the present invention provides that the MOS component is a power MOSFET. Such power MOSFETs are distinguished by a low channel resistance and may be practically utilized, in particular in the automotive industry.

It is particularly advantageous when the MOS component is usable as an antifuse. Such an element fulfills the purpose of creating a possibility, with the aid of an electronic component, of establishing a conductive connection in the event of a failure.

Advantageous refinements of the present invention are stated in the subclaims and are described in the description.

DETAILED DESCRIPTION

Figure 1:
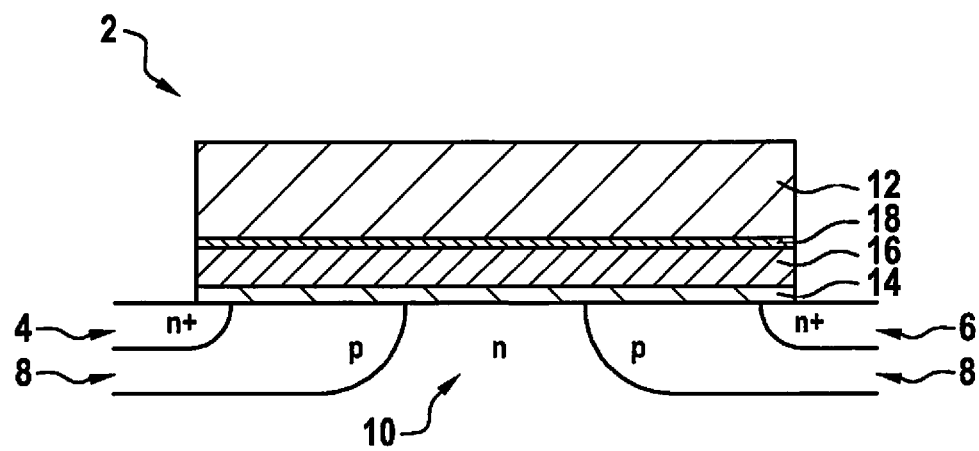
FIG. 1 shows a schematic cross section of a first exemplary embodiment of a MOS component according to the present invention.

FIG. 1 shows a MOS component 2 according to the present invention in the form of a MOSFET. This may be, for example, a DMOS (double-diffused metal-oxide semiconductor field effect transistor), a LIMOS (v-grooved MOS field-effect transistor), or a field plate-based MOSFET. The classical configuration of an npn-MOSFET is shown in the lower area of the figure. Strongly n-doped source area 4 as well as likewise strongly n-doped drain area 6, p-doped body area 8, which is connected with low resistance to source area 4, as well as n-doped channel area 10, in which a conductive channel forms upon application of a voltage to gate element 12 in the form of a gate electrode. Instead of an npn-MOSFET, it is also possible, of course, to construct a pnp-MOSFET according to the present invention. The sign of all dopings and voltages is then inverted and the type of majority charge carriers changes accordingly.

The stack-like layered design between the active semiconductor area, which is made up of source area 4, drain area 6, body area 8 and drift zone 10, and gate element 12 is essential to the present invention. In the case which is represented and, according to the present invention, is the simplest possible, this area is made up of three individual layers, namely a first individual layer 14, which may be referred to as bottom oxide, a second individual layer 16, which may be referred to as storage layer, and a third individual layer 18 which may be referred to as top oxide. It is apparent that bottom oxide 14 is designed to be thicker than top oxide 18. This is a substantial difference from the configuration of known MOSFETs in non-volatile memory chips, which is otherwise similar. This is due to the fact that, in the MOS component according to the present invention, storage layer 16 is charged and discharged by gate element 12, whereas the access to the storage layer takes place from the channel area in the case of the known non-volatile memory chips. First individual layer 14, i.e., the bottom oxide, should effectively suppress electron injections from channel area 10, however.

Figure 2:
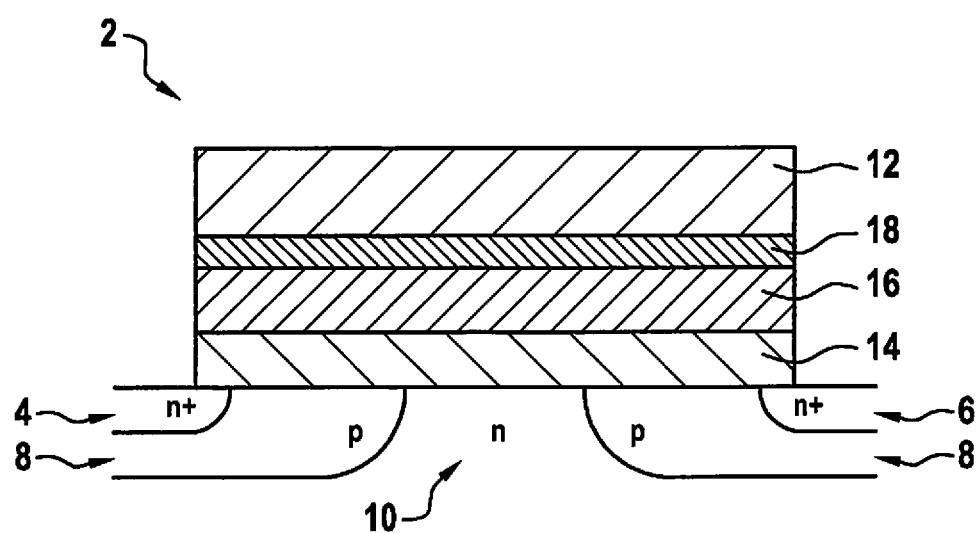
FIG. 2 shows a schematic cross section of a second exemplary embodiment of a MOS component according to the present invention.

FIG. 2 shows an exemplary embodiment similar to MOS component 2 shown in FIG. 1 including a specific configuration of the thicknesses of the three individual layers 14, 16, and 18. First individual layer 14, i.e., the bottom oxide, has a thickness of 10 nm and is relatively thick, and is made of silicon oxide. Second individual layer 16, i.e., the storage layer, is made of silicon nitride and likewise has a thickness of 10 nm. Third individual layer 18, i.e., the top oxide, is made, once again, of silicon oxide and has a relatively small thickness of 5 nm in order to allow for the tunneling of charge carriers through the third individual layer.

Charge carriers, i.e., either electrons or holes, may therefore already tunnel out of gate element 12 into storage layer 16 or out of storage layer 16 into gate element 12 upon application of relatively low voltages to gate element 12. Simultaneously, the thickness of bottom oxide 18 is great enough to prevent a tunneling into or out of the active semiconductor area through the bottom oxide. An entire equivalent oxide thickness (EOT) of approximately 20 nm results.

MOSFET 2 is manufactured using SONOS technology, i.e., includes a "silicon-oxide-nitride-oxide-silicon" stack. The first "silicon" refers to the gate electrode which is usually made of polysilicon, i.e., highly doped, polycrystalline silicon. As an alternative, the newer TANOS technology is also possible; in this case, a "tantalum nitride-aluminum oxide-(silicon-) nitride-oxide-silicon" stack is utilized. In this case, the gate material is tantalum nitride and the top oxide is made of aluminum oxide. This alternative has technical advantages, for example, since, due to the high work function of the gate material and the low barrier into the valence band of the $Al_2O_3$, a hole injection from the gate is promoted, which again allows for a lower trigger voltage and a shorter trigger pulse. The energy store, which is required in order to make the programming pulse and the trigger pulse available and which, for example, may be integrated into an ASIC, may then be made smaller. Due to the utilization of materials such as $Al_2O_3$ and tantalum nitride, the production is presently even more complex than in the conventional SONOS method, however.

Figure 3:
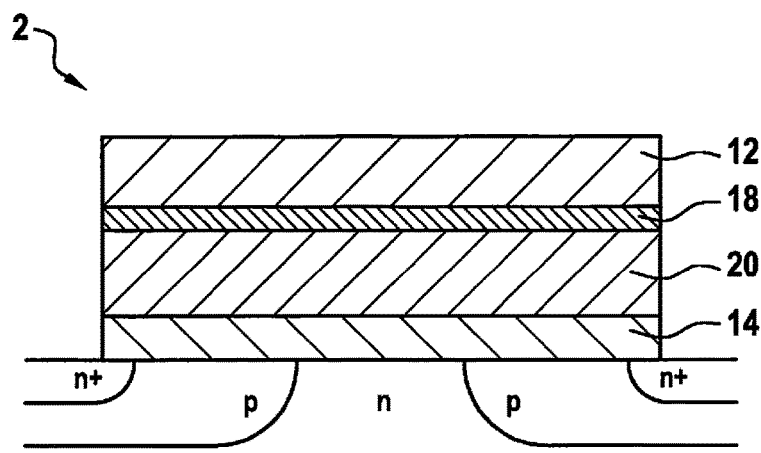
FIG. 3 shows a schematic cross section of a third exemplary embodiment of a MOS component according to the present invention.

FIG. 3 shows a variant in which the storage layer is designed not as a silicon nitride layer, but rather as a so-called floating gate 20. Floating gate 20 is made of polysilicon and is electrically completely insulated from the other active elements, such as source area 4, drain area 6, or gate element 12. In the case shown here, the thicknesses of bottom oxide 14 and of top oxide 18 corresponds to the exemplary embodiment represented in FIG. 2, although they may deviate from the values described there.

Figure 4:
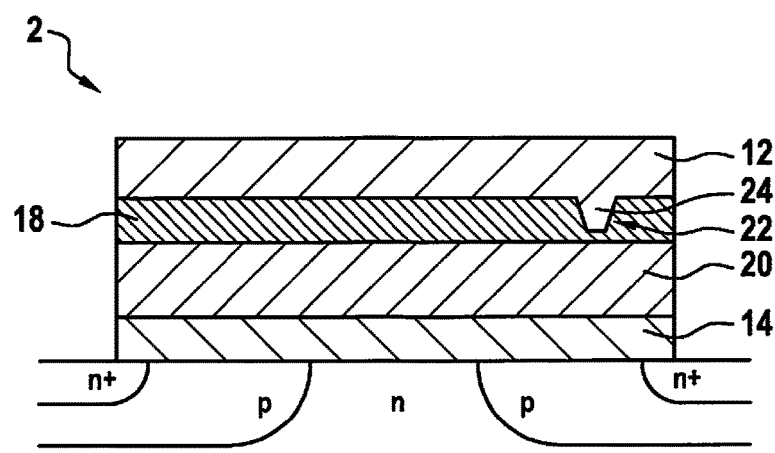
FIG. 4 shows a schematic cross section of a fourth exemplary embodiment of a MOS component according to the present invention.

FIG. 4 shows a variation of the exemplary embodiment represented in FIG. 3, in which top oxide 18 is thinned out in one area 22. Thinned-out area 22 is filled by an injection tip 24 of gate element 12 which is generally made of metal or polysilicon. Due to this construction, the tunneling of charge carriers out of gate element 12 into the storage layer is facilitated, although the likelihood for the reverse tunneling process out of storage layer 16 into gate element 12 changes only slightly. As a result, the storage layer in the form of floating gate 20 may be easily charged, but the introduced charge may be stored for the long-term in floating gate 20. A voltage having a lower absolute value is necessary for charging floating gate 20 than is the case for discharging.

Figure 5:
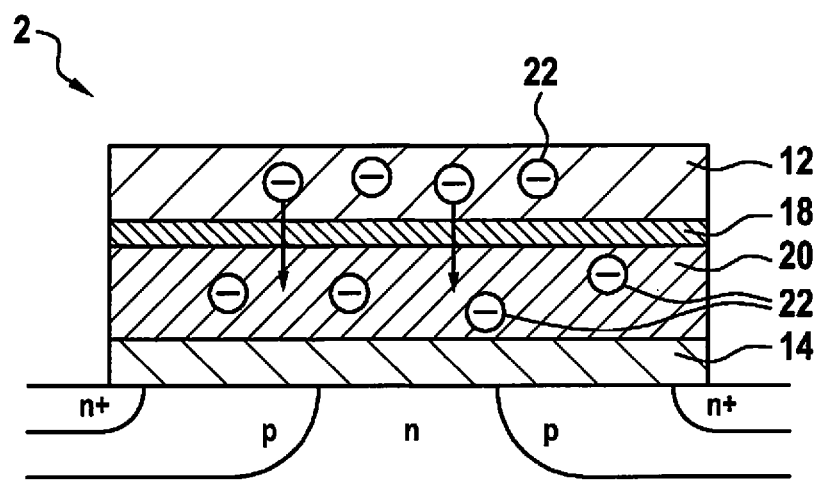
FIG. 5 shows a MOS component according to the present invention during the precharging of the storage layer.

FIG. 5 shows the exemplary embodiment from FIG. 3 during the precharging. In this case, due to a relatively high, in terms of absolute value, charge voltage of −20 V in the shown example, which is applied to gate element 12, the tunnel likelihood for electrons 22 is increased in such a way that a net charge transfer takes place from gate element 12 through top oxide 18 into the storage layer, which is designed as floating gate 20 once again in this case. If the charge voltage is now switched off, electrons 22 remain in floating gate 20. This state is stable for the long term and may last for 10 years or longer. Due to the charging of floating gate 20, MOSFET 2, which is conductive in the neutral state, i.e., is a "normally on" MOSFET, may be brought into a non-conductive state.

Figure 6:
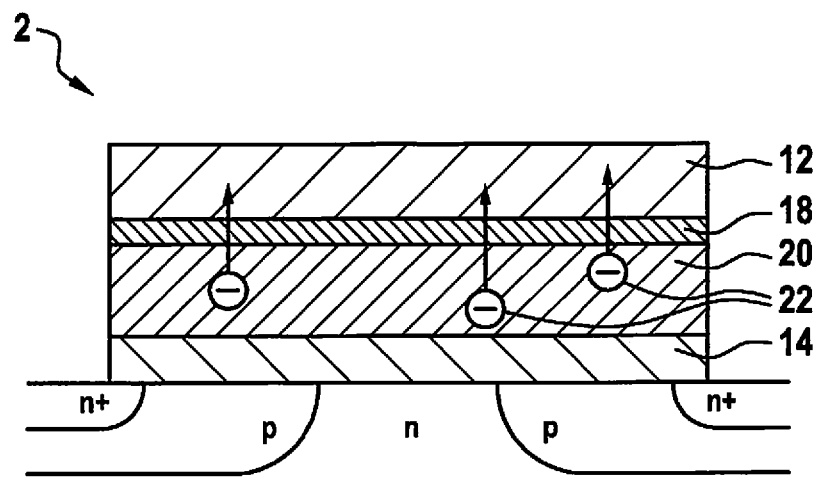
FIG. 6 shows a MOS component according to the present invention during the discharging of the storage layer.

The discharging of floating gate 20 is now represented in FIG. 6. A relatively low discharge voltage of +5 V, which is applied to gate element 20, suffices for this purpose. Electrons 22 now tunnel, once again, through top oxide 18 into gate element 20. The storage layer in the form of floating gate 20 is therefore discharged and becomes electrically neutral once again. MOSFET 2 therefore assumes its conductive state once again and may therefore be utilized as short-circuit protection or as an antifuse after the discharging of floating gate 20.

Figure 7:
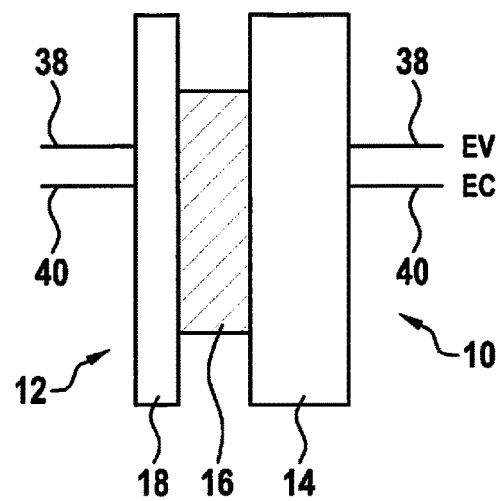
FIG. 7 shows a schematic band diagram for one exemplary embodiment in a SONOS design in the state having an uncharged storage layer.
Figure 8:
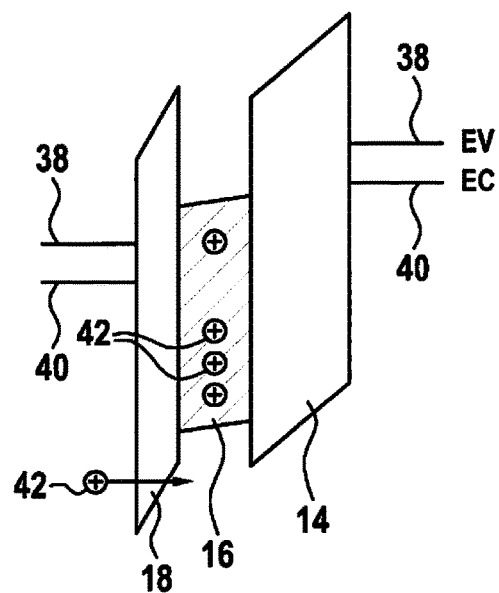
FIG. 8 shows a schematic band diagram for one exemplary embodiment in a SONOS design in the state having a charged storage layer.
Figure 9:
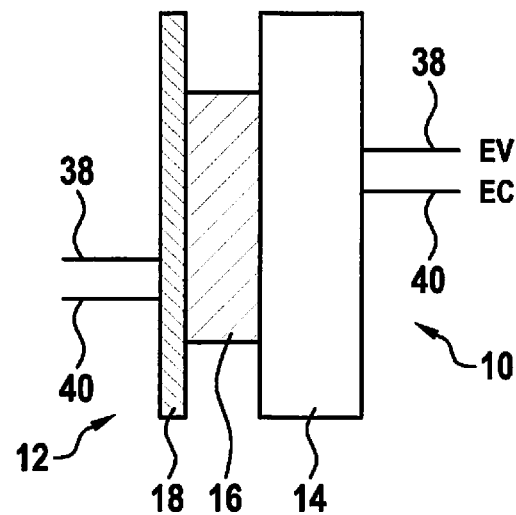
FIG. 9 shows a schematic band diagram for one exemplary embodiment in a TANOS design in the state having an uncharged storage layer.
Figure 10:
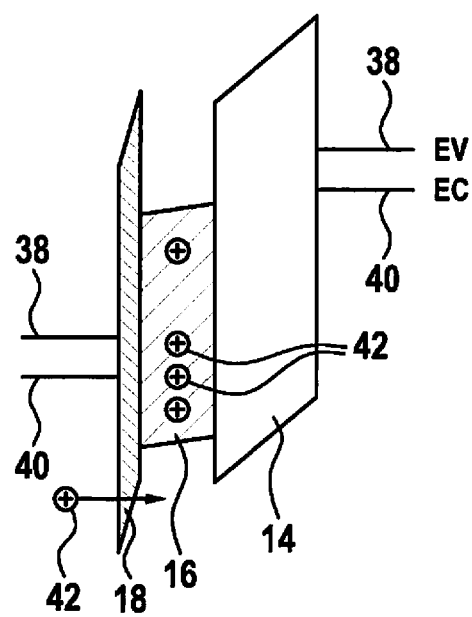
FIG. 10 shows a schematic band diagram for one exemplary embodiment in a TANOS design in the state having a charged storage layer.

FIGS. 7 through 10 show schematic band diagrams of the particular first through third individual layers 14, 16, and 18 including the lower edges of valence band 38 and the upper edges of conduction band 40. FIGS. 7 and 8 show a MOS component in a SONOS design and FIGS. 9 and 10 show a MOS component in a TANOS design. FIGS. 7 and 9 each show the state in which no voltage is applied to gate 12. FIGS. 8 and 10 show the state in which, during the programming pulse, a programming voltage, for example, of +5 V, is applied to gate 12. Bands 38, 40 each bend and allow for the tunneling of holes 42 into storage layer 16, where holes 42 accumulate as positive charges.

Figure 11:
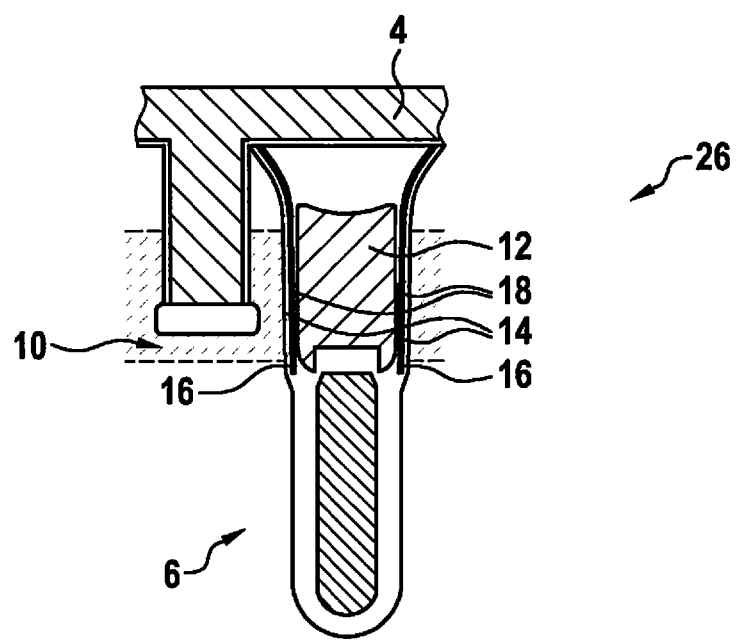
FIG. 11 shows a schematic cross section of a fifth exemplary embodiment of a MOS component according to the present invention in the form of a trench MOSFET.

FIG. 11 shows one embodiment variant as a vertical trench MOSFET 26. Drain area 6 is situated here in the lower area of the figure. Moreover, source area 4, body area 8, gate element 12, and field plate 26 are apparent. As is also the case for the horizontal MOSFET shown in FIGS. 1 through 6, the basic structure is sufficiently known from the related art. The layered design between gate element 12 and channel area 10, once again, is relevant to the present invention. The layered design is once again made up of a first individual layer 14, a second individual layer 16, and a third individual layer 18. The three individual layers 14, 16, and 18 jointly carry out the electrical insulation of gate element 12 with respect to channel area 10 and, therefore, with respect to the entire active semiconductor area of trench MOSFET 26, which is conventionally carried out by one single layer. Second individual layer 16 is once again designed as a silicon nitride layer. A floating gate would likewise be possible here, however.

The known processes must be only slightly modified for the purpose of manufacturing. In this case, the gate oxidation known from trench MOSFET is utilized as bottom oxide 14. Thereafter, a nitride layer 16 and top oxide layer 18 are deposited. The trench geometry changes only slightly. The modified cutoff voltage due to a higher EOT may be compensated for by way of the body doping.

Figure 12:
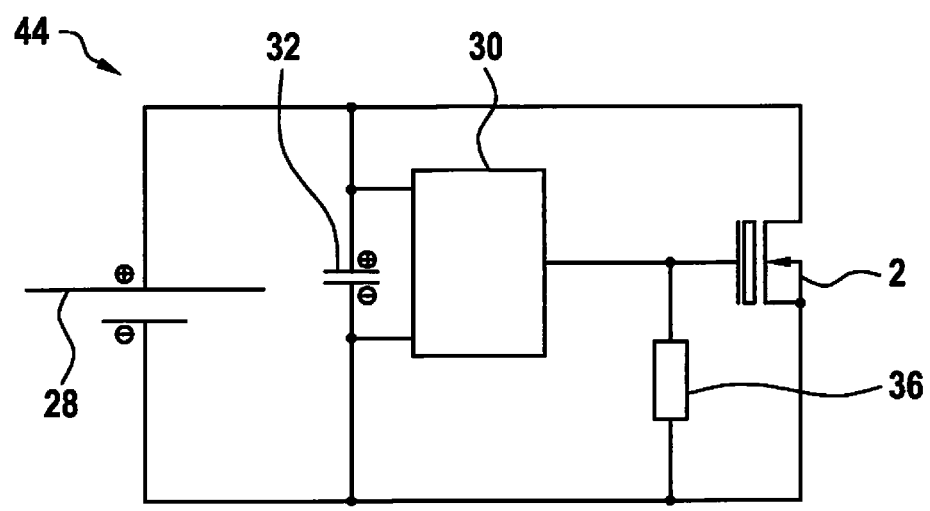
FIG. 12 shows a circuit diagram including a MOS component according to the present invention and an ASIC in the normal state.
Figure 13:
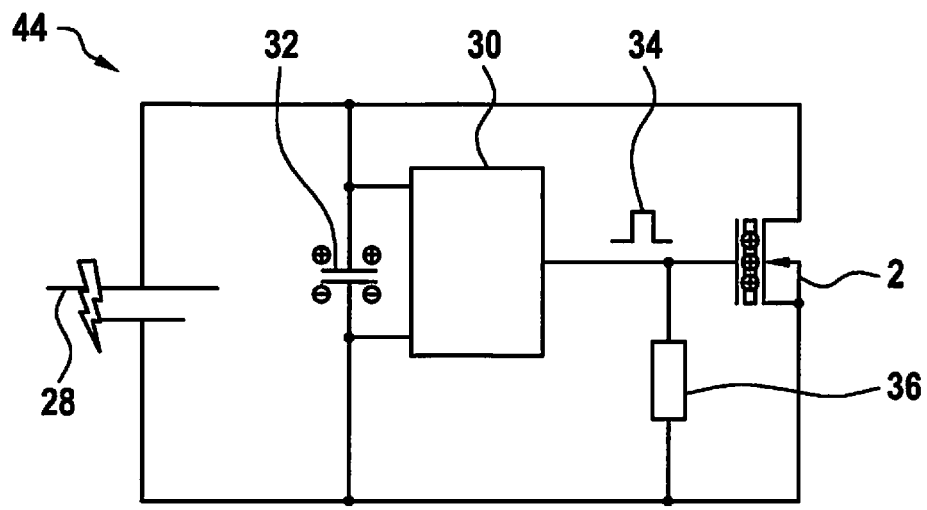
FIG. 13 shows a circuit diagram including a MOS component according to the present invention and an ASIC during the switching of the MOS component.
Figure 14:
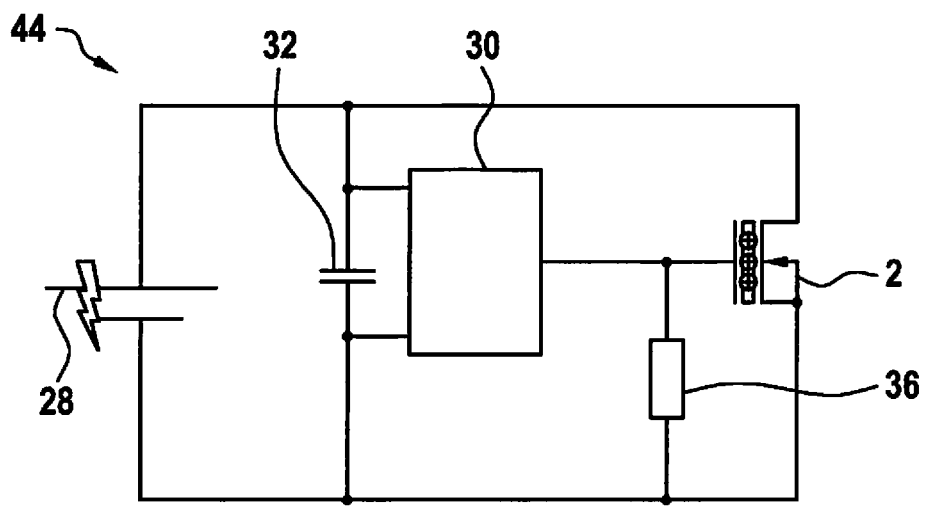
FIG. 14 shows a circuit diagram including a MOS component according to the present invention and an ASIC after the switching of the MOS component.

FIG. 12 shows a circuit diagram for a MOS component according to the present invention in the form of a MOSFET 2. This is connected in series to the battery to be protected or to a battery cell 28. A separate circuit in the form of an ASIC 30 is utilized for monitoring the state of battery cell 28. In the event of a fault in battery cell 28, a separate small charge store 32, for example, in the form of a capacitor, is integrated into ASIC 30. ASIC 30 outputs a switch or trigger pulse 34 to MOSFET 2 upon detection of a fault condition of battery cell 28, as shown in FIG. 13. Due to the external short circuit with the aid of MOSFET 2 or due to the fault condition of battery cell 28 itself, the voltage at ASIC 30 and at charge store 32 now drops, so that a signal may no longer be generated here. This is represented in FIG. 14. The storage charge of charge store 32 is reliably sufficient, however, for initiating a trigger pulse 34 of the required magnitude. Due to trigger pulse 34, MOSFET 2 is switched on and the above-described injection takes place. This occasionally takes place very rapidly, for example, in a time between 100 μs and 1 ms, similar to the known chargetrapping storages. After discontinuation of trigger pulse 34 due to the collapse of the ASIC voltage supply, MOSFET 2 remains "on" due to the injected holes in the storage layer, i.e., MOSFET 2 is in the depletion mode.

The ONO or ANO construction (oxide-nitride-oxide or aluminum oxide-nitride-oxide) ensures that the charge permanently remains in charge carrier 32 and, therefore, remains "on" throughout the service life. A permanent short circuit of battery cell 28 in the event of a fault is therefore ensured.

What is claimed is:

1. A MOS component, comprising:
    a gate element;
    a channel area; and
    an electrically insulating layer that includes at least three individual layers situated between the gate element and the channel area, wherein:
        a first individual layer of the at least three individual layers is adjacent to the gate element and is made of an electrically insulating material,
        a second individual layer of the at least three individual layers abuts neither the gate element nor the channel area and is a storage layer suitable for permanently storing charges, and
        a third individual layer of the at least three individual layers is adjacent to the channel area and is made of an electrically insulating material, and
        an entirety of the at least three individual layers situated between the channel area and the second individual layer has an equivalent oxide thickness which is greater than an entirety of an equivalent oxide thicknesses of the at least three individual layers situated between the second individual layer and the gate area.

2. A MOS component, comprising:
    a gate element;
    a channel area; and
    an electrically insulating layer that includes at least three individual layers situated between the gate element and the channel area, wherein:
        a first individual layer of the at least three individual layers is adjacent to the gate element and is made of an electrically insulating material,
        a second individual layer of the at least three individual layers abuts neither the gate element nor the channel area and is a storage layer suitable for permanently storing charges, and
        a third individual layer of the at least three individual layers is adjacent to the channel area and is made of an electrically insulating material, and
        an entirety of the at least three individual layers situated between the channel area and the second individual layer has an equivalent oxide thickness which is greater than an entirety of an equivalent oxide thicknesses of the at least three individual layers situated between the second individual layer and the gate area,
    wherein an entire equivalent oxide thickness of all the at least three individual layers situated between the gate element and the channel area is between 15 nm and 25 nm.

3. The MOS component as recited in claim 1, wherein an entire equivalent oxide thickness of all the at least three individual layers situated between the gate element and the channel area is between 18 nm and 22 nm.

4. The MOS component as recited in claim 1, wherein an entire equivalent oxide thickness of all the at least three individual layers situated between the gate element and the channel area is between 19 nm and 21 nm.

5. The MOS component as recited in claim 1, wherein the second individual layer is a floating gate.

6. A MOS component, comprising:
    a gate element;
    a channel area; and
    an electrically insulating layer that includes at least three individual layers situated between the gate element and the channel area, wherein:
        a first individual layer of the at least three individual layers is adjacent to the gate element and is made of an electrically insulating material,
        a second individual layer of the at least three individual layers abuts neither the gate element nor the channel area and is a storage layer suitable for permanently storing charges, and
        a third individual layer of the at least three individual layers is adjacent to the channel area and is made of an electrically insulating material, and
        an entirety of the at least three individual layers situated between the channel area and the second individual layer has an equivalent oxide thickness which is greater than an entirety of an equivalent oxide thicknesses of the at least three individual layers situated between the second individual layer and the gate area,
    wherein the second individual layer has a thickness between 8 nm and 12 nm.

7. The MOS component as recited in claim 1, wherein the second individual layer has a thickness between 9 nm and 11 nm.

8. The MOS component as recited in claim 1, wherein the second individual layer has a thickness between 9.5 nm and 10.5 nm.

9. A MOS component, comprising:
    a gate element;
    a channel area; and
    an electrically insulating layer that includes at least three individual layers situated between the gate element and the channel area, wherein:
        a first individual layer of the at least three individual layers is adjacent to the gate element and is made of an electrically insulating material,
        a second individual layer of the at least three individual layers abuts neither the gate element nor the channel area and is a storage layer suitable for permanently storing charges, and
        a third individual layer of the at least three individual layers is adjacent to the channel area and is made of an electrically insulating material, and
        an entirety of the at least three individual layers situated between the channel area and the second individual layer has an equivalent oxide thickness which is greater than an entirety of an equivalent oxide thicknesses of the at least three individual layers situated between the second individual layer and the gate area,
    wherein, upon application of a programming voltage to the gate element having an absolute value of 15 V to 25 V, charges tunnel from the gate element into the second individual layer or from the second individual layer into the gate element, while, simultaneously, no charges tunnel from the second individual layer into the channel area or from the channel area into the second individual layer.

10. The MOS component as recited in claim 1, wherein, upon application of a programming voltage to the gate element having an absolute value of 18 V to 22 V, charges tunnel from the gate element into the second individual layer or from the second individual layer into the gate element, while, simultaneously, no charges tunnel from the second individual layer into the channel area or from the channel area into the second individual layer.

11. The MOS component as recited in claim 1, wherein, upon application of a programming voltage to the gate element having an absolute value of 19 V to 21 V, charges tunnel from the gate element into the second individual layer or from the second individual layer into the gate element, while, simultaneously, no charges tunnel from the second individual layer into the channel area or from the channel area into the second individual layer.

12. A MOS component, comprising:
a gate element;
a channel area; and
an electrically insulating layer that includes at least three individual layers situated between the gate element and the channel area, wherein:
  a first individual layer of the at least three individual layers is adjacent to the gate element and is made of an electrically insulating material,
  a second individual layer of the at least three individual layers abuts neither the gate element nor the channel area and is a storage layer suitable for permanently storing charges, and
  a third individual layer of the at least three individual layers is adjacent to the channel area and is made of an electrically insulating material, and
  an entirety of the at least three individual layers situated between the channel area and the second individual layer has an equivalent oxide thickness which is greater than an entirety of an equivalent oxide thicknesses of the at least three individual layers situated between the second individual layer and the gate area,
wherein a programming voltage in the form of a voltage pulse having a length between 100 μs and 1 ms suffices for changing a charge in the second individual layer with the aid of a tunnel current in such a way that the MOS component permanently transitions from a blocking state into a conductive state, or vice versa.

13. A MOS component, comprising:
a gate element;
a channel area; and
an electrically insulating layer that includes at least three individual layers situated between the gate element and the channel area, wherein:
  a first individual layer of the at least three individual layers is adjacent to the gate element and is made of an electrically insulating material,
  a second individual layer of the at least three individual layers abuts neither the gate element nor the channel area and is a storage layer suitable for permanently storing charges, and
  a third individual layer of the at least three individual layers is adjacent to the channel area and is made of an electrically insulating material, and
  an entirety of the at least three individual layers situated between the channel area and the second individual layer has an equivalent oxide thickness which is greater than an entirety of an equivalent oxide thicknesses of the at least three individual layers situated between the second individual layer and the gate area,
wherein the second individual layer is electrically precharged in a delivery state of the MOS component.

14. A MOS component, comprising:
a gate element;
a channel area; and
an electrically insulating layer that includes at least three individual layers situated between the gate element and the channel area, wherein:
  a first individual layer of the at least three individual layers is adjacent to the gate element and is made of an electrically insulating material,
  a second individual layer of the at least three individual layers abuts neither the gate element nor the channel area and is a storage layer suitable for permanently storing charges, and
  a third individual layer of the at least three individual layers is adjacent to the channel area and is made of an electrically insulating material, and
  an entirety of the at least three individual layers situated between the channel area and the second individual layer has an equivalent oxide thickness which is greater than an entirety of an equivalent oxide thicknesses of the at least three individual layers situated between the second individual layer and the gate area,
wherein the MOS component is usable as an antifuse.

15. An electrical circuit, comprising:
an ASIC; and
a MOS component that includes:
  a gate element,
  a channel area, and
  an electrically insulating layer that includes at least three individual layers situated between the gate element and the channel area, wherein:
    a first individual layer of the at least three individual layers is adjacent to the gate element and is made of an electrically insulating material,
    a second individual layer of the at least three individual layers abuts neither the gate element nor the channel area and is a storage layer suitable for permanently storing charges, and
    a third individual layer of the at least three individual layers is adjacent to the channel area and is made of an electrically insulating material, and
  an entirety of the at least three individual layers situated between the channel area and the second individual layer has an equivalent oxide thickness which is greater than an entirety of an equivalent oxide thicknesses of the at least three individual layers situated between the second individual layer and the gate area.

16. A battery unit for a motor vehicle, comprising:
a MOS component that includes:
  a gate element,
  a channel area, and
  an electrically insulating layer that includes at least three individual layers situated between the gate element and the channel area, wherein:

a first individual layer of the at least three individual layers is adjacent to the gate element and is made of an electrically insulating material, a second individual layer of the at least three individual layers abuts neither the gate element nor the channel area and is a storage layer suitable for permanently storing charges, and a third individual layer of the at least three individual layers is adjacent to the channel area and is made of an electrically insulating material, and an entirety of the at least three individual layers situated between the channel area and the second individual layer has an equivalent oxide thickness which is greater than an entirety of an equivalent oxide thicknesses of the at least three individual layers situated between the second individual layer and the gate area.

17. A battery unit for a motor vehicle, comprising:

an ASIC; and a MOS component that includes:
 a gate element,
 a channel area, and
 an electrically insulating layer that includes at least three individual layers situated between the gate element and the channel area, wherein:
  a first individual layer of the at least three individual layers is adjacent to the gate element and is made of an electrically insulating material,
  a second individual layer of the at least three individual layers abuts neither the gate element nor the channel area and is a storage layer suitable for permanently storing charges, and
  a third individual layer of the at least three individual layers is adjacent to the channel area and is made of an electrically insulating material, and
  an entirety of the at least three individual layers situated between the channel area and the second individual layer has an equivalent oxide thickness which is greater than an entirety of an equivalent oxide thicknesses of the at least three individual layers situated between the second individual layer and the gate area.

* * * * *